United States Patent
Furukawa et al.

(10) Patent No.: US 7,951,660 B2
(45) Date of Patent: May 31, 2011

(54) METHODS FOR FABRICATING A METAL-OXIDE-SEMICONDUCTOR DEVICE STRUCTURE

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1453 days.

(21) Appl. No.: 10/703,355

(22) Filed: Nov. 7, 2003

(65) Prior Publication Data
US 2005/0098804 A1    May 12, 2005

(51) Int. Cl.
*H01L 21/336* (2006.01)
(52) U.S. Cl. ........ 438/197; 438/151; 438/149; 438/311; 257/E21.444

(58) Field of Classification Search .................. 438/151, 438/149, 311; 257/E21.201
See application file for complete search history.

(56) References Cited

U.S. PATENT DOCUMENTS

| 5,440,161 A * | 8/1995 | Iwamatsu et al. ............. 257/349 |
| 2002/0009837 A1 * | 1/2002 | Iwamatsu et al. ............. 438/151 |

\* cited by examiner

*Primary Examiner* — Thanh Nguyen
(74) *Attorney, Agent, or Firm* — Wood, Herron & Evans, LLP

(57) ABSTRACT

A method for fabricating a metal-oxide-semiconductor device structure. The method includes introducing a dopant species concurrently into a semiconductor active layer that overlies an insulating layer and a gate electrode overlying the semiconductor active layer by ion implantation. The thickness of the semiconductor active layer, the thickness of the gate electrode, and the kinetic energy of the dopant species are chosen such that the projected range of the dopant species in the semiconductor active layer and insulating layer lies within the insulating layer and a projected range of the dopant species in the gate electrode lies within the gate electrode. As a result, the semiconductor active layer and the gate electrode may be doped simultaneously during a single ion implantation and without the necessity of an additional implant mask.

25 Claims, 3 Drawing Sheets

METHODS FOR FABRICATING A METAL-OXIDE-SEMICONDUCTOR DEVICE STRUCTURE

FIELD OF THE INVENTION

The invention relates to semiconductor device fabrication and, more particularly, to a method of fabricating a metal-oxide-semiconductor (MOS) device structure on a silicon-on-insulator (SOI) substrate.

BACKGROUND OF THE INVENTION

The development of silicon-on-insulator (SOI) technology, in which devices are fabricated in a thin active layer of silicon overlying an insulator layer, has resulted in significant device performance improvements. Metal-oxide-semiconductor field effect transistors (MOSFET's) have been fabricated using SOI technology. Generally, MOSFET's operate by electronically varying the resistivity of a channel in a channel region, which is defined in the silicon active layer, along which carriers flow from a source to a drain, also defined in the silicon active layer and separated by a channel length. In n-channel MOSFET's, electrons are responsible for conduction in the channel and, in p-channel MOSFET's, holes are responsible for conduction in the channel. Output current is controlled by voltage applied to a polysilicon gate electrode, which is located above the channel region between the source and drain. The gate electrode is insulated from the channel region by a thin gate dielectric.

The material of the gate electrode is heavily doped polysilicon with a dopant concentration so that the gate electrode of the MOSFET is highly conductive. Similarly, portions of the silicon active layer are heavily doped with dopant concentrations effective to create the source and drain of the MOSFET. The source and drain are of the same conductivity type and are of opposite conductivity type to that of the channel region. N-channel MOSFET's are fabricated in a p-type portion of the active layer, normally with an $n^+$-doped source and drain on opposite sides of an $n^+$-doped polysilicon gate electrode and underlying p-type channel. P-channel MOSFET's are fabricated in an n-type portion of the active layer, normally with a $p^+$-doped source and drain on opposite sides of a $p^+$-doped polysilicon gate electrode and underlying n-type channel. Typically, n-wells defining n-type portions are formed by ion implantation or deposition and diffusion in a p-type active layer.

Ion implantation allows for exceptional control and reproducibility in the introduction of a dopant into thin surface layers, such as the silicon active layer and the gate electrode of MOSFET's. Implanted ions impinge the surface and travel below it to create, after the ions are fully stopped, a depth profile. In particular, controlling ion energy is one factor that establishes the depth profile of an implanted dopant. As a result, the semiconductor industry has accepted ion implantation as a preferred method for doping the gate electrode, source and drain of MOSFET's.

Downscaling to meet an increasing need for faster devices, higher performance, and lower power dissipation has driven the gate dielectric in MOSFET's to become ever thinner. As the gate dielectric thickness shrinks to less than two (2) nanometers, transistor performance has suffered because of the depletion of carriers in the polysilicon gate electrode when a voltage is applied to the gate electrode. Carrier depletion occurs when the device is fully turned on and free carriers are swept away from the base of the polysilicon gate electrode due to high vertical electric fields. Carrier depletion increases the effective thickness of the gate dielectric beyond its actual thickness, thereby reducing transistor performance. Carrier depletion may be alleviated by increasing the dopant concentration or doping level in the polysilicon gate electrode.

In one MOSFET fabrication scheme, the polysilicon gate electrode is doped simultaneously with the source and drain by a single ion implantation process. The energy of the implanted ions is selected such that their projected range in the active layer lies within the thickness of the active layer for forming the source and drain and their projected range in the gate electrode lies within the thickness of the gate electrode. For purposes of overcoming carrier depletion, however, merely increasing the implanted dose to elevate the dopant concentration in the polysilicon gate electrode sufficiently to overcome carrier depletion will increase the dopant concentration in the source and drain beyond design parameters. For example, increasing the implanted dose sufficient to produce a ten-fold increase in the dopant concentration in the gate electrode would increase the dopant concentration in the active layer by approximately an order of magnitude beyond design parameters.

In an alternative MOSFET fabrication scheme, a blanket layer of polysilicon is covered by a patterned photoresist layer and a gate dopant is implanted into unmasked areas of the pattern to create doped regions subsequently formed into gate electrodes. If the substrate is to carry both n-channel MOSFET's and p-channel MOSFET's, another mask and implant step is required to introduce a second dopant type for other gate electrodes. The gate electrode implantations are performed before gate electrode definition so that the high-dose implanted dopants do not penetrate into the source and drain, which are subsequently created by separate ion implantation or diffusion steps and with typical typical parameters. As a result, a critical etch step defining the gate electrodes must be done on polysilicon containing two different high concentrations of dissimilar dopant species, which significantly degrades linewidth control.

What is needed, therefore, is a method of ion implanting the source, the drain and the gate electrode of MOSFET's in a single process step performed without masking steps and without introducing excessive dopant concentrations into the source and drain.

SUMMARY OF THE INVENTION

In accordance with the principles of the invention, a method is provided for forming a device structure in which a substrate is formed that includes an insulating layer, a semiconductor active layer overlying the insulating layer, a gate dielectric overlying the semiconductor active layer, and a gate electrode overlying the gate dielectric. The semiconductor active layer is characterized by a first thickness and the gate electrode is characterized by a second thickness. A dopant species is implanted into the active layer and the gate electrode at a kinetic energy such that a first projected range of the dopant species impinging the semiconductor active layer and the insulating layer lies in the insulating layer and a second projected range of the dopant species impinging the gate electrode is less than the second thickness. The invention is further directed to a device structure formed by this method.

In another aspect, the invention is directed to an ion implantation method in which a dopant species is implanted into a substrate including an insulating layer and a semiconductor active layer characterized by a first thickness overlying the insulating layer at a kinetic energy such that a first projected range of the dopant species is greater than the first thickness. The ion implantation method further includes implanting the dopant species concurrently into a gate electrode characterized by a second thickness overlying the semiconductor active layer such that a second projected range of the dopant species in the gate electrode is less than the second thickness.

In another aspect of the invention, a device structure comprises a substrate including an insulating layer, a semiconductor active layer characterized by a first thickness overlying the insulating layer, and a gate electrode characterized by a second thickness formed on the semiconductor active layer. The device structure further includes a first depth profile of a dopant species in the semiconductor active layer and the insulating layer having a first projected range greater than the first thickness and a second depth profile of the dopant species in the gate electrode having a second projected range less than the second thickness.

In yet another aspect of the invention, a device structure comprises a substrate including an insulating layer, a semiconductor active layer characterized by a first thickness overlying the insulating layer, and a gate electrode characterized by a second thickness formed on the semiconductor active layer. The semiconductor active layer and the gate electrode are implanted with a dopant species at a kinetic energy such that a first projected range of the dopant species impinging the semiconductor active layer and the insulating layer lies in the insulating layer and a second projected range of the dopant species impinging the gate electrode is less than the second thickness.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to concurrently introducing a dopant concentration in a gate electrode, a source and a drain of a MOSFET with a single ion implantation step. In accordance with the principles of the invention, the ion energy of the implanted dopant, the thickness of the semiconductor active layer, and the thickness of the gate electrode are collectively selected such that the projected range of the dopant depth profile in the gate electrode is less than the gate electrode thickness and the projected range of the dopant depth profile in the active layer is greater than the active layer thickness. Preferably, the resultant dopant concentration is larger in the gate electrode than in the source and drain formed in the semiconductor active layer. The composition of the gate electrode may also be modified for controlling the depth of dopant introduction. As a result, the source, drain and gate electrode may be doped using a single ion implantation and without the necessity of an additional implant mask as the dopant species is implanted after patterning the gate electrode.

Figure 1:
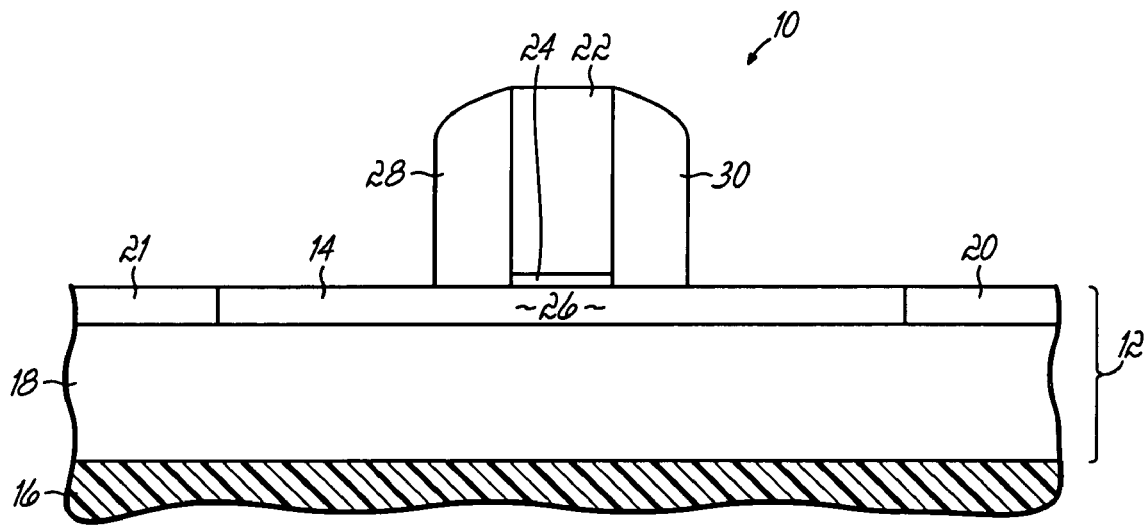
FIG. 1 is a diagrammatic cross-sectional view of a portion of a substrate.

With reference to FIG. 1, a MOSFET semiconductor device 10 is formed on a silicon-on-insulator (SOI) substrate 12 that includes an active layer 14 of semiconductor material separated vertically from a handle wafer 16 by an insulating layer 18. The SOI substrate 12 may be fabricated by any suitable technique, such as wafer bonding or a separation by implantation of oxygen (SIMOX) technique. In the illustrated embodiment, the active layer 14 is made from silicon, which may be initially doped with an n-type dopant species to render it n-type or a p-type dopant species to render it p-type. The handle wafer 16 may be formed from any suitable material including, but not limited to, silicon and polycrystalline silicon (polysilicon). Insulating layer 18 and shallow trench isolation (STI) regions 20, 21 in active layer 14 flanking the MOSFET semiconductor device 10 cooperate for defining an electrically-isolated region of semiconductor material in active layer 14 for device 10. The STI regions 20, 21 are constructed by any suitable STI technique, such as etching trenches into the active layer 14 and then filling the trenches with a dielectric fill material. The dielectric material constituting insulating layer 18 and STI regions 20, 21 is typically silicon dioxide, but is not so limited.

A gate conductor or electrode 22 is provided on the active layer 14 using standard processing techniques. In an exemplary embodiment of the invention, a blanket layer of polysilicon deposited using a chemical vapor deposition (CVD) technique on the active layer 14 is patterned and etched to form gate electrode 22. A gate dielectric 24, such as a thin film of silicon oxide ($SiO_2$) or silicon oxynitride ($SiO_xN_y$), is situated between the gate electrode 22 and a channel region 26 defined in the active layer 14. The gate dielectric 24 may be grown by thermal oxidation of the active layer 14, before the gate electrode 22 is formed, by subjecting the SOI substrate 12 to an oxygen-laden, heated ambient in, for example, an oxidation furnace or a rapid thermal anneal chamber. The thickness of gate dielectric 24 may vary depending upon the required performance of the semiconductor device 10. In many instances, the thickness is less than about 2 nanometers.

Generally, the gate electrode 22 overlies the channel region 26 so that voltage applied to gate electrode 22 can define a channel in the channel region 26 and control the resistivity of the defined channel. Insulating spacers 28, 30 are formed on opposed side walls of the gate electrode 22 flanking the channel region 26. The insulating spacers 28, 30 are formed using conventional techniques, such as depositing a blanket layer of a dielectric, such as silicon nitride ($Si_3N_4$) or $SiO_2$ deposited by CVD, on the active layer 14 followed by anisotropically etching the blanket layer using conventional methods so that portions of the blanket layer are removed from substantially horizontal surfaces at a faster rate than removal from substantially vertical surfaces. Source/drain extensions (not shown) may be implanted into active layer 14 adjacent to the base of the gate electrode 22 before insulating spacers 28, 30 are formed.

Figure 2:
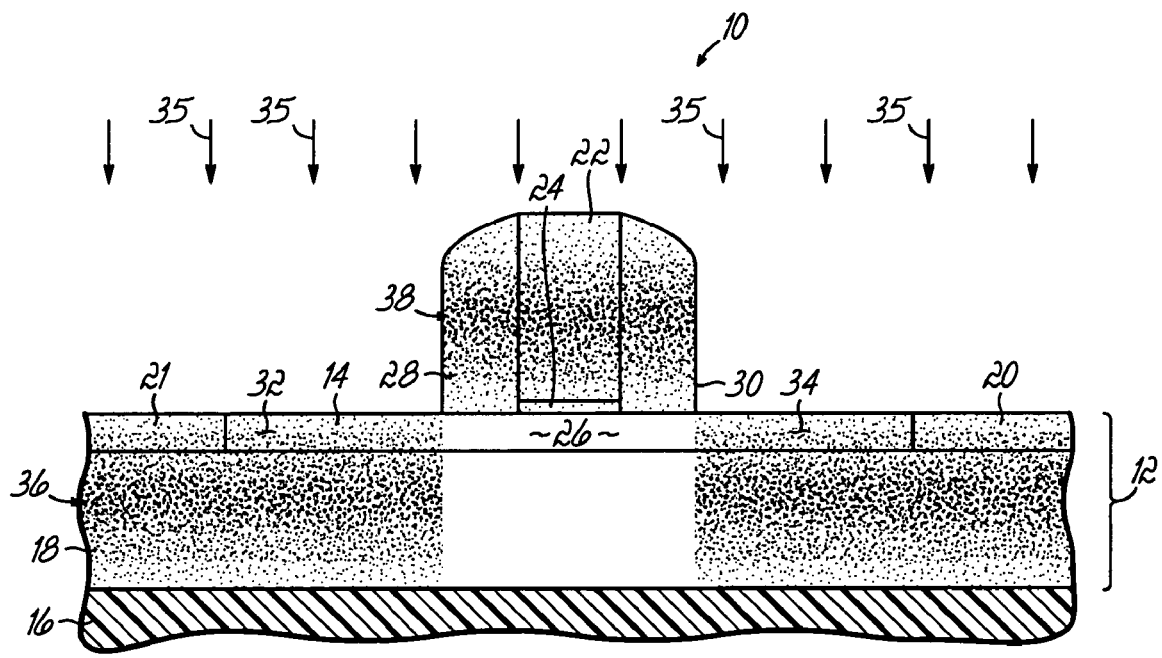
FIG. 2 is a diagrammatic cross-sectional view similar to FIG. 1 following ion implantation with a dopant species in accordance with the principles of the invention.

With reference to FIG. 2, a source 32 and a drain 34 are defined in the active layer 14 by an ion implantation process that also introduces a dopant concentration into the gate electrode 22. Gate electrode 22 serves as a mask to the underlying channel region 26 in a self-aligned process that allows precise spatial definition of the source 32 and drain 34. The ion implantation process introduces ions of a dopant species having a selected atomic mass at a given kinetic energy and ion dose, as indicated diagrammatically by vertical arrows 35. After the dopant species is introduced, the active layer 14 and the insulating layer 18 include a depth distribution or profile, generally indicated by reference numeral 36, of the implanted dopant species that defines the source 32 and drain 34, and the gate electrode 22 contains a distinct depth profile, indicated generally by reference numeral 38, of the implanted dopant species. The normal orientation of arrows 35 should not be construed as limiting the invention as the ions may impinge the upper surface of SOI substrate 12 and gate electrode 22 at an acute or non-perpendicular incident angle. The relative concentration of dopant species as a function of depth in each of the profiles 36 and 38 is diagrammatically reflected by the dot density.

An n-type dopant species, including but not limited to arsenic and phosphorus, is implanted into a p-type region of active layer 14 to form an n$^+$-doped source 32 and drain 34 and an n$^+$-doped gate electrode 22 in an n-channel MOSFET device 10. Similarly, a p-type dopant species, such as boron, is implanted into an n-type region of active layer 14 to form a p$^+$-doped source 32 and drain 34 and a p$^+$-doped gate electrode 22 in a p-channel MOSFET device 10. For integrated circuits including both n-channel and p-channel MOSFET devices 10, a mask (not shown) may used to protect the source 32, drain 34 and gate electrode 22 of n-channel MOSFET's when a p-type dopant is implanted and, similarly, a mask may used to protect the source 32, drain 34 and gate electrode 22 of p-channel MOSFET's when an n-type dopant is implanted. After each individual implantation, the appropriate mask is stripped before the subsequent processing step.

With continued reference to FIG. 2, the implantation profiles 36, 38 are each characterized by a peak dopant concentration, a projected range that represents the distance beneath the surface at which the peak dopant concentration occurs, and a range straggle that represents a standard deviation of the projected range. In a simplified first order approximation that ignores profile skewness and kurtosis, each of the depth profiles 36, 38 may be characterized by a Gaussian distribution having a projected range and range straggle. The projected range and range straggle of each of the depth profiles 36, 38 is dependent upon the atomic mass of the dopant species, the composition of the material into which the dopant species is implanted, and the initial kinetic energy of the dopant species. The projected range and range straggle of the implanted dopant in the active layer 14 and in the gate electrode 22 may be predicted using any conventional theoretical model or any conventional simulation technique or, alternatively, may be measured post-implantation by any suitable analytical technique. The effect of lateral range straggle upon depth profile 36 as understood by persons of ordinary skill in the art is ignored in FIG. 2.

In accordance with the principles of the invention, the thickness of the gate electrode 22, the thickness of the active layer 14, and the kinetic energy of the implanted dopant ions are chosen such that the projected range of the depth profile 38 lies within the gate electrode 22, and such that the projected range of the depth profile 36 lies below the active layer 14 in the insulating layer 18. Preferably, the projected range of depth profile 38 is sufficiently above the interface between the gate electrode 22 and the gate dielectric 24 that an end-of-range tail of the depth profile 38 does not extend into the gate dielectric 24 and the channel region 26. However, the invention is not so limited as a portion of the end-of-range tail may extend into the gate dielectric 24 and the channel region 26 provided that either the concentration of dopant species introduced into the gate dielectric 24 and the channel region 26 is insufficient to alter their respective electrical properties or the alteration in the respective electrical properties due to the introduced concentration of dopant species is insignificant. Thinning the active layer 14 has the effect of reducing the dopant concentration in the source 32 and drain 34 arising from dopant profile 36 under equivalent ion implantation conditions as fewer of the implanted ions stop in the active layer 14. Reducing the ion kinetic energy has the effect of reducing the projected range of the depth profiles 36, 38. Increasing the thickness of the gate electrode 22 will require a higher implanted dose, which will also increase the dopant concentration in the source 32 and drain 34 if the thickness of the active layer 14 is not reduced.

Generally, the vertical thickness of the gate electrode 22 is selected to be about five (5) to about ten (10) times the thickness of the active layer 14 and the kinetic energy is selected such that the sum of the projected range and at least four (4) times the range straggle is less than the vertical thickness of the gate electrode 22, which keeps implanted dopant out of the channel region 26 as the gate electrode 22 acts as an implant mask. The implanted dose in the gate electrode 22 may be selected to provide an average dopant concentration in depth profile 38 of at least about $1.5 \times 10^{21}$ atoms/cm$^3$ and an average dopant concentration of the portion of the depth profile 36 in the active layer 14 to form source 32 and the drain 34 effective to provide a dopant concentration of at least about $1.0 \times 10^{20}$ atoms/cm$^3$. Generally, the implanted dose is effective to provide a dopant concentration in the gate electrode 22 that is approximately at least an order of magnitude greater than the dopant concentration in the active layer 14, which increases the dopant concentration approximately ten-fold in the gate electrode 22 while maintaining the dopant concentration in the active layer 14 at a conventional level. A predicted dopant concentration in the active layer 14 may be estimated from theoretical calculations or simulations by integrating the portion of the depth profile 36 that stops in the gate electrode 22.

In certain embodiments of the invention, the material for the gate electrode 22 is selected to be a polycrystalline silicon-germanium alloy (poly-Si$_x$Ge$_{1-x}$) in which the silicon atomic concentration ranges from about 40% to about 70% and the germanium atomic concentration ranges from about 30% to about 60%. The gate electrode 22 of poly-Si$_x$Ge$_{1-x}$ has a thickness ranging from about 150 nm to about 250 nm. The specific numerical value of the poly-Si$_x$Ge$_{1-x}$ thickness is selected in conjunction with the thickness of the active layer 14 in accordance with the principles of the invention. The poly-Si$_x$Ge$_{1-x}$ may be deposited, for example, by a Low Pressure Chemical Vapor Deposition (LPCVD) process using silane (SiH$_4$) and germane (GeH$_4$) as reactant gasses.

The kinetic energy of the implanted ions is dissipated by two primary scattering effects that cause an energy loss, namely, elastic nuclear collisions and inelastic electronic interactions. The total stopping power is defined as the energy loss per unit path length of the ion and collectively includes energy loss arising from both primary scattering effects. Adding germanium to the composition of the material forming the gate electrode 22 increases the total stopping power, which shortens the projected range of the implanted dopant in depth profile 38, and therefore, permits the vertical thickness of the gate electrode 22 to be thinned. Thinning the gate electrode 22 has the effect of reducing the dose required to provide an equivalent dopant concentration following a thermal cycle.

Following implantation, the substrate 12 carrying MOSFET device 10 is subjected to a thermal cycle that redistributes the dopant of depth profiles 36 and 38. An exemplary thermal cycle suitable would be a rapid temperature anneal (RTA) at about 900° C. to about 1,100° C. in an inert ambient, such as $N_2$, for a period of about one (1) millisecond to about thirty (30) seconds. The thermal cycle causes the dopant atoms to diffuse throughout the bulk of the material forming gate electrode 22, which increases the uniformity of the dopant concentration, and increases the dopant concentration proximate to the gate dielectric 24. Typically, the dopant atoms are substantially uniformly distributed in the gate electrode 22 following the thermal cycle, which increases the conductivity of the gate electrode 22. Preferably, the portion of the gate electrode 22 proximate the gate dielectric 24 has a relatively high dopant concentration. The thermal cycle also diffuses and activates the implanted dopant atoms in the source 32 and the drain 34. In addition, other thermal cycles may be conducted as desired. The thermal annealing conditions are constrained, however, to avoid or, at the least limit, dopant diffusion from the gate electrode 22 through the gate dielectric 24 into the channel region 26.

In certain embodiments of the invention, an ancillary implantation may be performed with the dopant species introduced at a lower kinetic energy for adjusting the dopant concentration in the active layer 14. This would be appropriate in situations in which the principle implantation, described above, results in a deficiency of the dopant species in the active layer 14 for forming the source 32 and drain 34. The additional dopant concentration introduced into the gate electrode 22 by the lower energy implantation would increase its electrical conductivity.

In other embodiments of the invention, a temporary capping layer (not shown) may be provided over the gate electrode 22 for reducing the projected range of the ions in the gate electrode 22. The capping layer would be formed from a material that operates as a diffusion barrier so that dopant would not diffuse across the interface between the gate electrode 22 and the capping layer into the capping layer during the thermal cycle that redistributes the dopant species within gate electrode 22. The capping layer may be removed following the conclusion of the thermal cycle. The capping layer would permit the thickness of the gate electrode 22 to be reduced.

Figure 3:
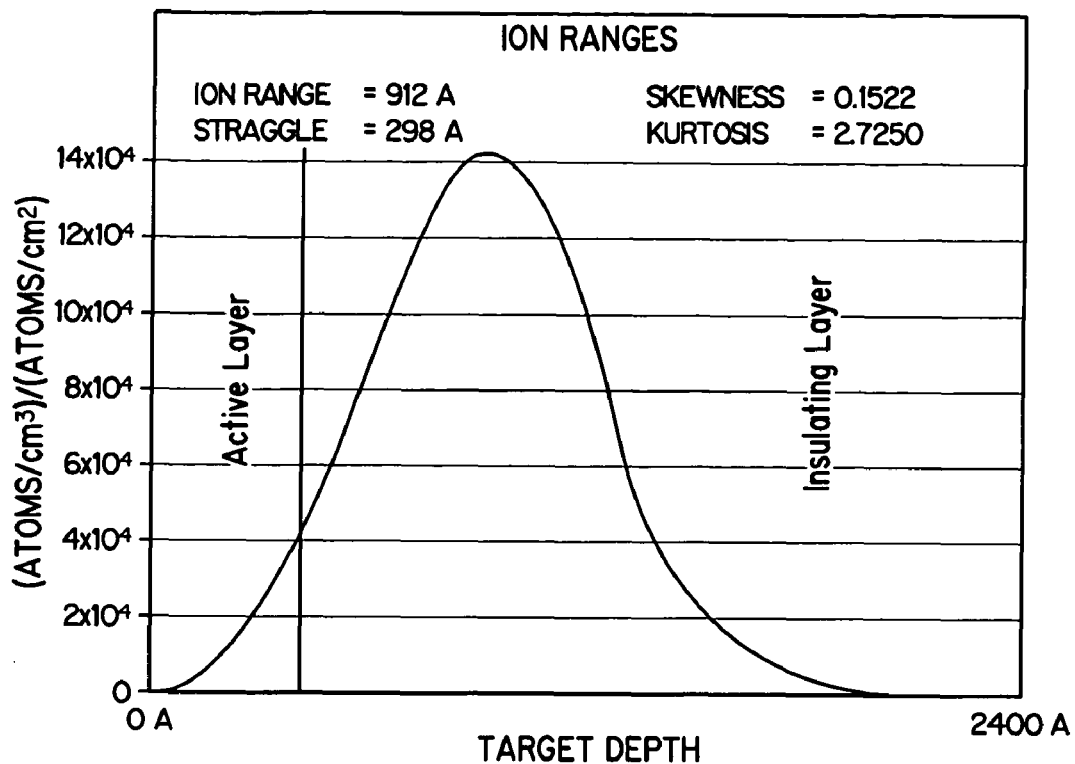
FIG. 3 is a depth profile of arsenic ions implanted in the active layer and insulating layer in accordance with an embodiment of the invention.
Figure 4:
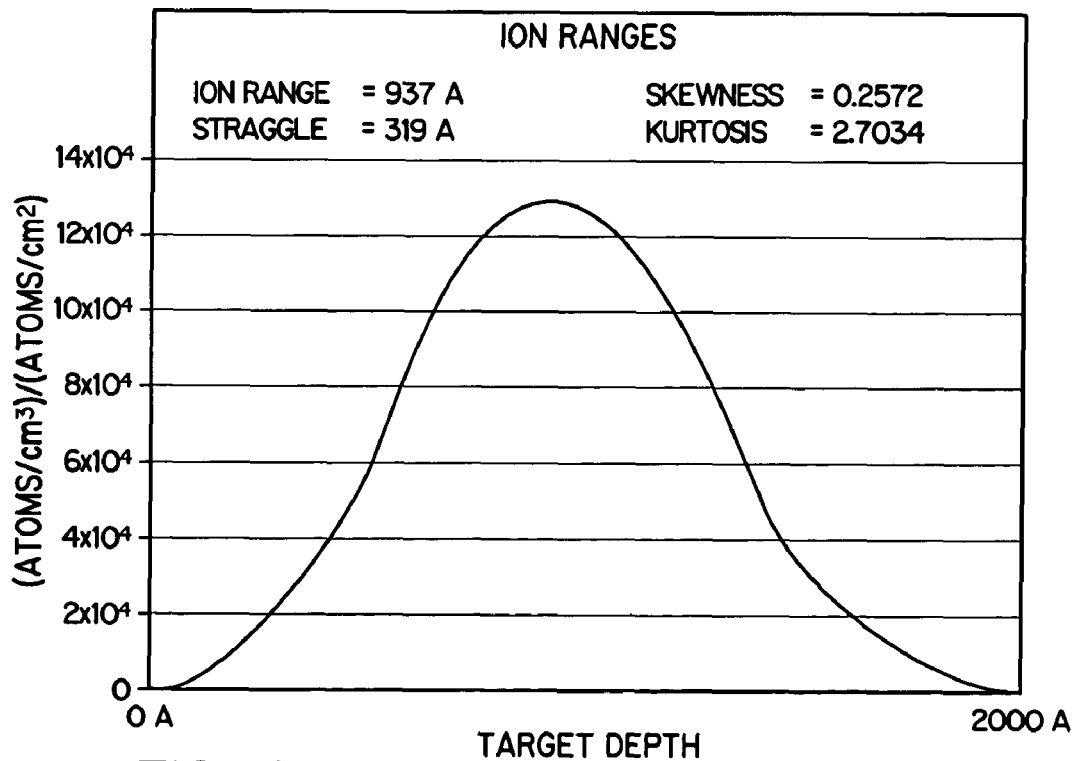
FIG. 4 is a depth profile similar to FIG. 3 of arsenic ions implanted in the gate electrode.

With reference to FIGS. 3 and 4 and in accordance with a specific embodiment of the invention, the implantation process to form an n-channel MOSFET device 10 may be made by selecting the thickness of the gate electrode 22 to be 200 nanometers, the thickness of the active layer 14 to be 40 nanometers, and implanting arsenic (As) at an energy of 135 keV, and an ion dose of about $6\times10^{16}$ atoms/cm$^2$. As is apparent from FIG. 3, the As depth profile 38 is substantially contained within the gate electrode 22 and the majority of the As depth profile 36 creating the source 32 and drain 34 in active layer 14 lies within the insulating layer 18. The concentration of As in the gate electrode 22 is calculated from FIG. 3 to be about $3\times10^{21}$ atoms/cm$^3$ and the average concentration of As stopping in the active layer 14 estimated from FIG. 4 is about $7\times20^{20}$ atoms/cm$^3$. As a person of ordinary skill in the art will appreciate, the ion implantation process forming the n-channel MOSFET device 10 may be performed using alternative dopants and/or at other appropriate energy levels and dose levels, as is desirable for the n-channel MOSFET device 10 being fabricated and consistent with the principles of the invention.

Figure 5:
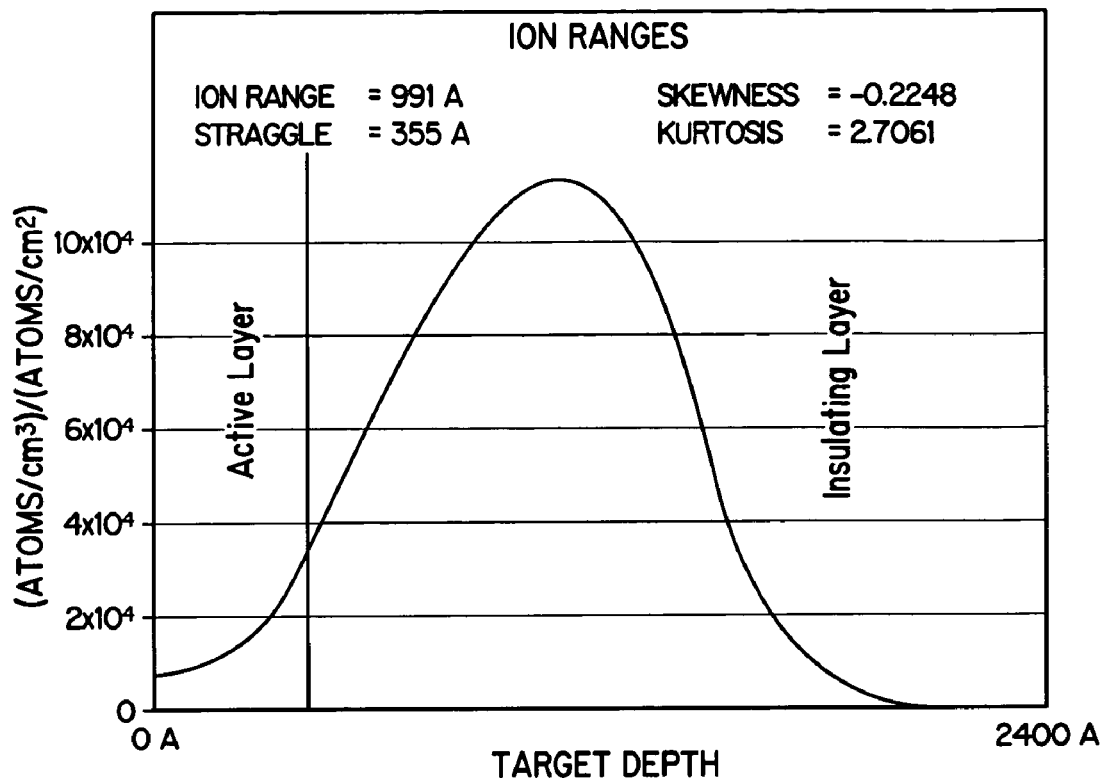
FIG. 5 is a depth profile of boron ions implanted in the active layer and insulating layer in accordance with an embodiment of the invention.
Figure 6:
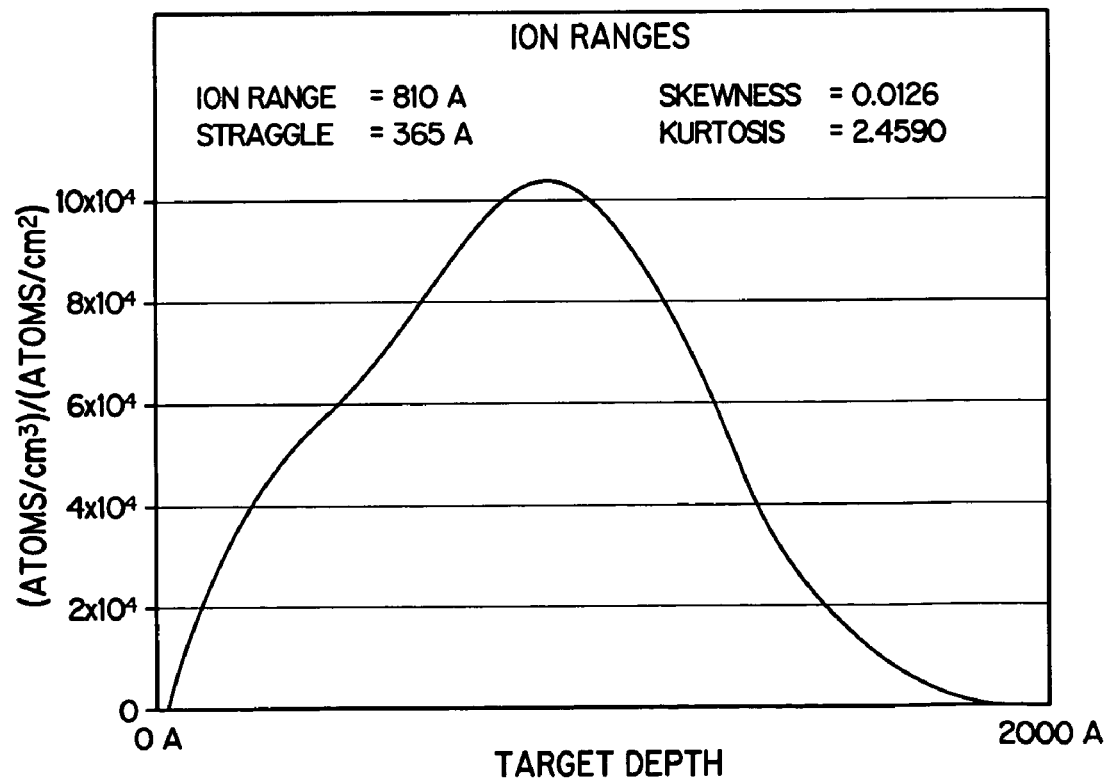
FIG. 6 is a depth profile similar to FIG. 5 of boron ions implanted in the gate electrode in accordance with an embodiment of the invention.

With reference to FIGS. 5 and 6 and in accordance with another specific embodiment of the invention, the implantation process to form a p-channel MOSFET device 10 may be made by selecting the thickness of the gate electrode 22 to be 200 nanometers, the thickness of the active layer 14 to be 40 nanometers, and implanting boron (B) at an energy of 25 keV, and an ion dose of about $5\times10^{16}$ atoms/cm$^2$. As is apparent from FIG. 5, the B depth profile 38 is substantially contained within the gate electrode 22 and the majority of the B depth profile 36 creating the source 32 and drain 34 in active layer 14 lies within the insulating layer 18. The concentration of B in the gate electrode 22 is calculated from FIG. 5 to be about $2.5\times10^{21}$ atoms/cm$^3$ and the average concentration of B stopping in the active layer 14 estimated from FIG. 6 is about $6\times20^{20}$ atoms/cm$^3$. As a person of ordinary skill in the art will appreciate, the ion implantation process forming the p-channel MOSFET device 10 may be performed using alternative dopants and/or at other appropriate energy levels and dose levels, as is desirable for the p-channel MOSFET device 10 being fabricated and consistent with the principles of the invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for making a device structure using a substrate with an insulating layer and a semiconductor active layer characterized by a first thickness overlying the insulating layer, comprising:

forming a gate dielectric overlying the semiconductor active layer and a gate electrode characterized by a second thickness overlying the gate dielectric; and implanting a dopant species concurrently into the semiconductor active layer and the gate electrode at a kinetic energy such that a first projected range of the dopant species impinging the semiconductor active layer adjacent to the gate electrode lies in the insulating layer and a second projected range of the dopant species impinging the gate electrode is less than the second thickness.

2. The method of claim 1 wherein implanting the dopant species further comprises:

forming a source in the semiconductor active layer and a drain in the semiconductor active layer disposed on opposite sides of the gate electrode, the source and the drain being separated by a channel region in the semiconductor active layer generally underlying the gate electrode.

3. The method of claim 2 wherein the gate electrode serves as an implant mask for the channel region.

4. The method of claim 1 wherein the gate electrode is formed from a material selected from the group consisting of polycrystalline silicon and polycrystalline silicon-germanium.

5. The method of claim 4 wherein the substrate is a silicon-on-insulator substrate and the semiconductor active layer is formed from silicon.

6. The method of claim 1 wherein the gate dielectric has a thickness of less than or equal to about 2 nanometers.

7. The method of claim 1 wherein the second thickness of the gate electrode is about five to about ten times thicker than the first thickness of the semiconductor active layer.

8. The method of claim 1 wherein the kinetic energy is selected such that the sum of a projected range of the dopant species and at least four times the range straggle of the dopant species is less than the second thickness of the gate electrode.

9. The method of claim 1 further comprising:
exposing the substrate to a thermal cycle after the dopant species is implanted such that an average concentration of the dopant species is larger in the gate electrode than in the semiconductor active layer following the thermal cycle.

10. The method of claim 9 wherein the average concentration of the dopant species in the gate electrode of at least about $1.5 \times 10^{21}$ atoms/cm$^3$.

11. The method of claim 10 wherein the average concentration of the dopant species in the semiconductor active layer is at least about $1.0 \times 10^{20}$ atoms/cm$^3$.

12. The method of claim 9 wherein the average concentration of the dopant species in the gate electrode is at least an order of magnitude larger than the average concentration of the dopant species in the semiconductor active layer.

13. An ion implantation method comprising:
implanting a dopant species into a substrate including an insulating layer and a semiconductor active layer characterized by a first thickness overlying the insulating layer at a kinetic energy such that a first projected range of the dopant species is greater than the first thickness; and
implanting the dopant species concurrently into a gate electrode characterized by a second thickness overlying the semiconductor active layer such that a second projected range of the dopant species in the gate electrode is less than the second thickness.

14. The ion implantation method of claim 13 wherein implanting the dopant species further comprises:
forming a source in the semiconductor active layer and a drain in the semiconductor active layer disposed on opposite sides of the gate electrode, the source and the drain being separated by a channel region in the semiconductor active layer generally underlying the gate electrode.

15. The ion implantation method of claim 13 wherein the gate electrode serves as an implant mask for the channel region.

16. The ion implantation method of claim 13 wherein the gate electrode is formed from a material selected from the group consisting of polycrystalline silicon and polycrystalline silicon-germanium.

17. The ion implantation method of claim 16 wherein the substrate is a silicon-on-insulator substrate and the semiconductor active layer is formed from silicon.

18. The ion implantation method of claim 13 further comprising:
forming a gate dielectric between the gate electrode and the semiconductor active layer.

19. The ion implantation method of claim 18 wherein the gate dielectric has a thickness of less than or equal to about 2 nanometers.

20. The ion implantation method of claim 13 wherein the second thickness of the gate electrode is about five to about ten times thicker than the first thickness of the semiconductor active layer.

21. The ion implantation method of claim 13 wherein the kinetic energy is selected such that the sum of a projected range of the dopant species and at least four times the range straggle of the dopant species is less than the second thickness of the gate electrode.

22. The ion implantation method of claim 13 further comprising:
exposing the substrate to a thermal cycle after the dopant species is implanted such that an average concentration of the dopant species is larger in the gate electrode than in the semiconductor active layer following the thermal cycle.

23. The ion implantation method of claim 22 wherein the average concentration of the dopant species in the gate electrode of at least about $1.5 \times 10^{21}$ atoms/cm$^3$.

24. The ion implantation method of claim 23 wherein the average concentration of the dopant species in the semiconductor active layer is at least about $1.0 \times 10^{20}$ atoms/cm$^3$.

25. The ion implantation method of claim 22 wherein the average concentration of the dopant species in the gate electrode is at least an order of magnitude larger than the average concentration of the dopant species in the semiconductor active layer.

* * * * *